(12) United States Patent
Jung

(10) Patent No.: US 6,736,895 B2
(45) Date of Patent: May 18, 2004

(54) SILICON CRYSTALLIZATION METHOD

(75) Inventor: Yun-Ho Jung, Seoul (KR)

(73) Assignee: LG. Philips LCD Co., Ltd., Seoul (KR)

(*) Notice: Subject to any disclaimer, the term of this patent is extended or adjusted under 35 U.S.C. 154(b) by 8 days.

(21) Appl. No.: 10/157,201

(22) Filed: May 30, 2002

(65) Prior Publication Data
US 2002/0179004 A1 Dec. 5, 2002

(30) Foreign Application Priority Data
Jun. 1, 2001 (KR) .......................... 2001-30698

(51) Int. Cl.$^7$ .......................... C30B 25/02; C30B 25/04
(52) U.S. Cl. .............................. 117/37; 117/41; 117/43
(58) Field of Search .............................. 117/37, 41, 43, 117/932; 438/22

(56) References Cited

FOREIGN PATENT DOCUMENTS

| JP | 62-26884 | 2/1987 |
| JP | 4-180686 | 6/1992 |
| WO | 97/45827 | 12/1997 |

*Primary Examiner*—Felisa Hiteshew
(74) *Attorney, Agent, or Firm*—McKenna Long & Aldridge LLP

(57) ABSTRACT

A mask and its application in sequential lateral solidification (SLS) crystallization of amorphous silicon are provided. The mask includes a light absorptive portion for blocking a laser beam and a plurality of stripe-shaped light transmitting portions for passing the laser beam. Each stripe-shaped light transmitting portion is rectangular-shaped, and each light-transmitting portion includes triangular-shaped or semicircular-shaped edges on both sides. The distance between the adjacent light transmitting portions is less than the width of the light transmitting portion. The width of the light transmitting portions is less than or equal to twice the maximum length of lateral grain growth that is to be grown by sequential lateral solidification (SLS).

18 Claims, 14 Drawing Sheets

SILICON CRYSTALLIZATION METHOD

This application claims the benefit of Korean Patent Application No. 2001-30698, filed on Jun. 1, 2001 in Korea, which is hereby incorporated by reference as if fully set forth herein.

BACKGROUND OF THE INVENTION

1. Field of the Invention

The present invention relates to a method of crystallizing an amorphous silicon film, and more particularly, to a crystallization method using sequential lateral solidification (SLS).

2. Discussion of Related Art

Polycrystalline silicon (p-Si) and amorphous silicon (a-Si) are often used as the active layer material for thin film transistors (TFTs) in liquid crystal display (LCD) devices. Since amorphous silicon (a-Si) can be deposited at a low temperature to form a thin film on a glass substrate, amorphous silicon (a-Si) is commonly used in liquid crystal displays (LCDs). Unfortunately, amorphous silicon (a-Si) TFTs have relatively slow display response times that limit their suitability for large area LCDs.

In contrast, polycrystalline silicon TFTs provide much faster display response times. Thus, polycrystalline silicon (p-Si) is well suited for use in large LCD device, such as laptop computers and wall-mounted television sets. Such applications often require TFTs having field effect mobility greater than 30 $cm^2/Vs$ together with low leakage current.

A polycrystalline silicon film is composed of crystal grains having grain boundaries. The larger the grains and the more regular the grain boundaries, the better the field effect mobility. Thus, a silicon crystallization method that produces large grains, ideally a single crystal, would be useful.

One method of crystallizing amorphous silicon into polycrystalline silicon is sequential lateral solidification (SLS). SLS crystallization uses the fact that silicon grains tend to grow laterally from the interfaces between liquid and solid silicon. With SLS, amorphous silicon is crystallized using a laser beam having a magnitude and a relative motion that melts amorphous silicon such that the melted silicon forms laterally grown silicon grains upon re-crystallization.

FIG. 1A is a schematic configuration of a conventional sequential lateral solidification (SLS) apparatus, while FIG. 1B shows a plan view of a conventional mask 38 that is used in the apparatus of FIG. 1A. In FIG. 1A, the SLS apparatus 32 includes a laser generator 36, a mask 38, a condenser lens 40, and an objective lens 42, the laser generator 36 generates and emits a laser beam 34. The intensity of the laser beam 34 is adjusted by an attenuator (not shown) in the path of the laser beam 34. The laser beam 34 is then condensed by the condenser lens 40 and is then directed onto the mask 38.

The mask 38 includes a plurality of slits "A" through which the laser beam 34 passes, and light absorptive areas "B" that absorb the laser beam 34. The width of each slit "A" effectively defines the grain size of the crystallized silicon produced by a first laser irradiation. Furthermore, the distance between each slit "A" defines the size of the lateral grains growth of amorphous silicon crystallized by the SLS method. The objective lens 42 is arranged below the mask and reduces the shape of the laser beam that passed through the mask 38.

Still referring to FIG. 1A, an X-Y stage 46 is arranged adjacent to the objective lens 42. The X-Y stage 46, which is movable in two orthogonal axial directions, includes an x-axial direction drive unit for driving the x-axis stage and a y-axial direction drive unit for driving the y-axis stage. A substrate 44 is placed on the X-Y stage 46 so as to receive light from the objective lens 42. Although not shown in FIG. 1A, it should be understood that an amorphous silicon film is on the substrate 44, thereby defining a sample substrate.

To use the conventional SLS apparatus, the laser generator 36 and the mask 38 are typically fixed in a predetermined position while the X-Y stage 46 moves the amorphous silicon film on the sample substrate 44 in the x-axial and/or y-axial direction. Alternatively, the X-Y stage 46 may be fixed while the mask 38 moves to crystallize the amorphous silicon film on the sample substrate 44.

When performing SLS crystallization, a buffer layer is typically formed on the substrate. Then, the amorphous silicon film is deposited on the buffer layer. Thereafter, the amorphous silicon is crystallized as described above. The amorphous silicon film is usually deposited on the buffer layer using chemical vapor deposition (CVD). Unfortunately, the CVD method produces amorphous silicon with a lot of hydrogen. To reduce the hydrogen content the amorphous silicon film is typically thermal-treated, which causes dehydrogenation, which results in a smoother surface on the crystalline silicon film. If the dehydrogenation is not performed, the surface of the crystalline silicon film is rough and the electrical characteristics of the crystalline silicon film are degraded.

FIG. 2 is a plan view showing a substrate 44 having a partially-crystallized amorphous silicon film 52. When performing SLS crystallization, it is difficult to crystallize all of the amorphous silicon film 52 at once because the laser beam 34 has a limited beam width, and because the mask 38 also has a limited size. Therefore, with a large size substrate, the mask 38 is typically arranged in several times over the substrate, while crystallization is repeated for the various mask arrangements. In FIG. 2, an area "C" that corresponds to one mask position is defined as a block. Crystallization of the amorphous silicon within a block "C" is achieved by irradiating the amorphous silicon with the laser beam several times.

Crystallization of the amorphous silicon film will be explained as follows. FIGS. 3A to 3C are plan views showing one block of an amorphous silicon film being crystallized using a conventional SLS method. In the illustrated crystallization, it should be understood that the mask 38 (see FIGS. 1A and 1B) has three slits.

The length of the lateral growth of a grain is determined by the energy density of the laser beam, by the temperature of substrate, and by the thickness of amorphous silicon film (as well as other factors). The maximum lateral grain growth should be understood as being dependent on optimized conditions. In the SLS method shown in FIGS. 3A to 3C, the width of the slits is twice as large as the maximum lateral grain growth.

FIG. 3A shows an initial step of crystallizing the amorphous silicon film using a first laser beam irradiation. As described with reference to FIG. 1A, the laser beam 34 passes through the mask 38 and irradiates one block of an amorphous silicon film 52 on the sample substrate 44. The laser beam 34 is divided into three line beams by the three slits "A." The three line beams irradiate and melt regions "D", "E" and "F" of the amorphous silicon film 52. The energy density of the line beams should be sufficient to induce complete melting of the amorphous silicon film, i.e., complete melting regime.

Still referring to FIG. 3A, after complete melting the liquid phase silicon begins to crystallize at the interfaces 56a and 56b between the solid phase amorphous silicon and the liquid phase silicon. Namely, lateral grain growth of grains 58a and 58b proceeds from the un-melted regions to the fully-melted regions. Lateral growth stops in accordance with the width of the melted silicon region when: (1) grains grown from interfaces collide near a middle section 50a of the melted silicon region; or (2) polycrystalline silicon particles are formed in the middle section 50a as the melted silicon region solidifies sufficiently to generate solidification nuclei.

When the width of the slits "A" (see FIG. 1B) is larger than twice the maximum lateral growth length of the grains, the width of the melted silicon region "D," "E," or "F" is also larger than twice the maximum lateral growth length of the grains. Therefore, lateral grain growth stops when the polycrystalline silicon particles are formed in the middle section 50a. Such polycrystalline silicon particles act as solidification nuclei in a subsequent crystallization step.

As discussed above, the grain boundaries in directionally solidified silicon tend to form perpendicular to the interfaces 56a and 56b between the solid phase amorphous silicon and the liquid phase silicon. As a result of the first laser beam irradiation, crystallized regions "D," "E," and "F" are formed in one block. Additionally, solidification nuclei regions 50a are also formed.

As mentioned before, the length of lateral grain growth attained by a single laser irradiation depends on the laser energy density, the temperature of substrate, and the thickness of the amorphous silicon film. In the above-mentioned first laser beam irradiation, the grains generated by the lateral growth typically have a length generally ranging from 1 to 1.5 micrometers ($\mu$m).

FIG. 3B shows crystallizing the amorphous silicon film using a second laser beam irradiation. After the first laser beam irradiation, the X-Y stage or the mask 38 moves in a direction opposite to the lateral grain growth of the grains 58a or 58b (in FIG. 3A), i.e., an X-axial direction, by a distance of several micrometers, which is the same as or less than the maximum length of the lateral grain growth. Then, the second laser beam irradiation is conducted. During the second laser beam irradiation, the second laser beam irradiates portions of the grains 58a and a portion of amorphous silicon. The regions irradiated by the second laser beam are melted and crystallized as described above. The silicon grains 58a or/and the regions 50a generated by the first laser beam irradiation serve as seeds for the second crystallization. Thus the lateral grain growth proceeds in the second melted regions. Silicon grains 58c formed by the second laser beam irradiation continue to grow adjacent to the silicon grains 58a formed by the first laser beam irradiation, and silicon grains 58d grown from an interface 56c are also formed. The lateral growth of these grains 58c and 58d stops when the nuclei regions 50b are formed in a middle section of the silicon region melted by the second laser beam irradiation.

Accordingly, by repeating the foregoing steps of melting and crystallizing, one block of the amorphous silicon film is crystallized to form grains 58e as shown in FIG. 3C.

The above-mentioned crystallization processes conducted within one block are repeated block by block across the amorphous silicon film. Therefore, the large size amorphous silicon film is converted into a crystalline silicon film. While generally successful, the conventional SLS method described above has disadvantages.

Although the conventional SLS method produces relatively large size grains, the X-Y stage or the mask must repeatedly move a distance of several micrometers to induce lateral grain growth. Therefore, the time required to move the X-Y stage or the mask 38 takes up a major part of the total process time. This significantly decreases manufacturing efficiency.

SUMMARY OF THE INVENTION

Accordingly, the present invention is directed to a method of crystallizing an amorphous silicon film using a sequential lateral solidification (SLS) that substantially obviates one or more of problems due to limitations and disadvantages of the related art.

An advantage of the present invention is to provide a sequential lateral solidification (SLS) method, which saves time in crystallizing an amorphous silicon film to obtain an increase in productivity.

Another advantage of the present invention is to provide a method of crystallizing an amorphous silicon layer with increased manufacturing yield using the improved SLS method.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a method for crystallizing an amorphous silicon film in a sequential lateral solidification (SLS) apparatus includes the steps of locating a substrate having the amorphous silicon film in a sequential lateral solidification (SLS) apparatus; irradiating the amorphous silicon film in a first irradiated region using a laser beam that passes through a mask, wherein the mask includes a light absorptive portion for blocking a laser beam and a plurality of stripe-shaped light transmitting portions for passing the laser beam, wherein each light-transmitting portion includes triangular-shaped or semicircular-shaped edges on both sides, and wherein laterally growing grains are formed by growing laterally from an interface between liquid silicon and solid silicon; moving the mask in an X-axial direction by a distance less than the length of the light transmitting portions to overlap the previously crystallized grain regions; and performing a second crystallization such that laterally growing grains grows in a second irradiated region. The method for crystallizing the amorphous silicon film further includes moving the mask a plurality of times in the X-axial direction to complete the X-axis directional crystallization, and also includes moving the mask in a Y-axial direction by a distance less than the width of light transmitting portions after the amorphous silicon film is crystallized in the X-axial direction. After moving the mask in the Y-axial direction, a second X-axis directional crystallization is conducted. In the above-mentioned mask, the distance between the adjacent light transmitting portions is less than the width of the light transmitting portion. Additionally, the width of the light transmitting portions is less than or equal to twice the maximum length of lateral grain growth that is to be grown by the sequential lateral solidification (SLS). Each of the light transmitting portions can be shaped like a rectangle.

In another aspect, a mask for crystallizing an amorphous silicon film in a sequential lateral solidification (SLS) apparatus includes a light absorptive portion for blocking a laser beam and a plurality of stripe-shaped light transmitting portions for passing the laser beam. Each light-transmitting portion includes triangular-shaped or semicircular-shaped edges on both sides. The distance between the adjacent light transmitting portions is less than the width of the light transmitting portions. The width of the light transmitting portions is less than or equal to twice the maximum length of lateral grain growth that is to be grown by sequential lateral solidification (SLS).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are shown in the accompanying drawings. Wherever possible, similar reference numbers will be used throughout the drawings to refer to the same or like parts.

Figure 4:
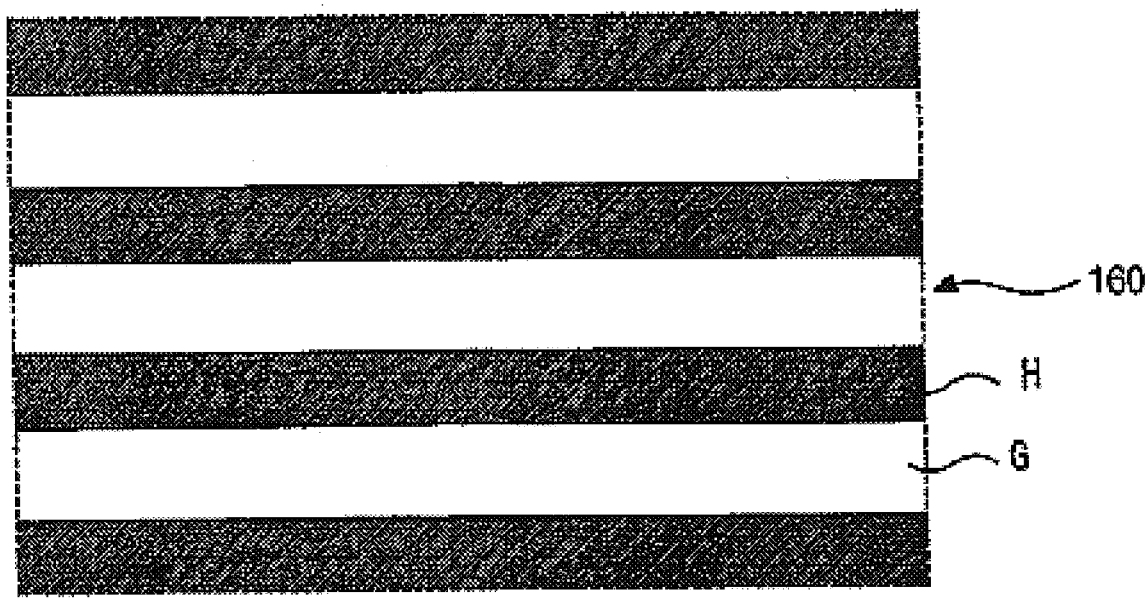
FIG. 4 is a plan view of a mask that is used for crystallization according to a first embodiment of the present invention.

FIG. 4 is a plan view of a mask 160 that is used in a SLS method according to a first embodiment of the present invention. The mask 160 has light transmitting portions "G" and light absorptive portions "H." Although the mask 160 is similar to the mask 38 shown in FIG. 1B, the width of the lateral stripe-shaped light transmitting portions "G" is less than twice the maximum lateral grain growth length. Furthermore, the width of the light absorptive portions "H" is less than that of the lateral stripe-shaped light transmitting portions "G." Namely, the distance between the adjacent light transmitting portions "G" is less than their width.

Figure 3A:
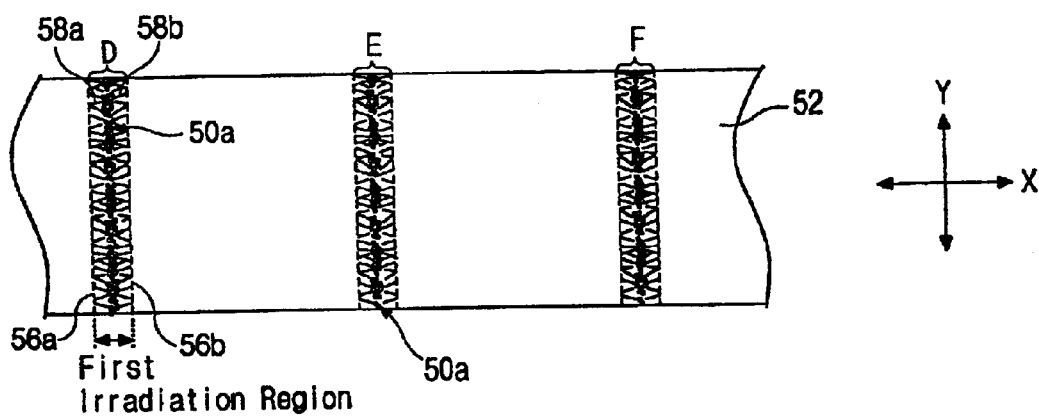
FIGS. 3A to 3C are plan views showing one block of an amorphous silicon film in the crystallization process steps by using a conventional SLS method.
Figure 3B:
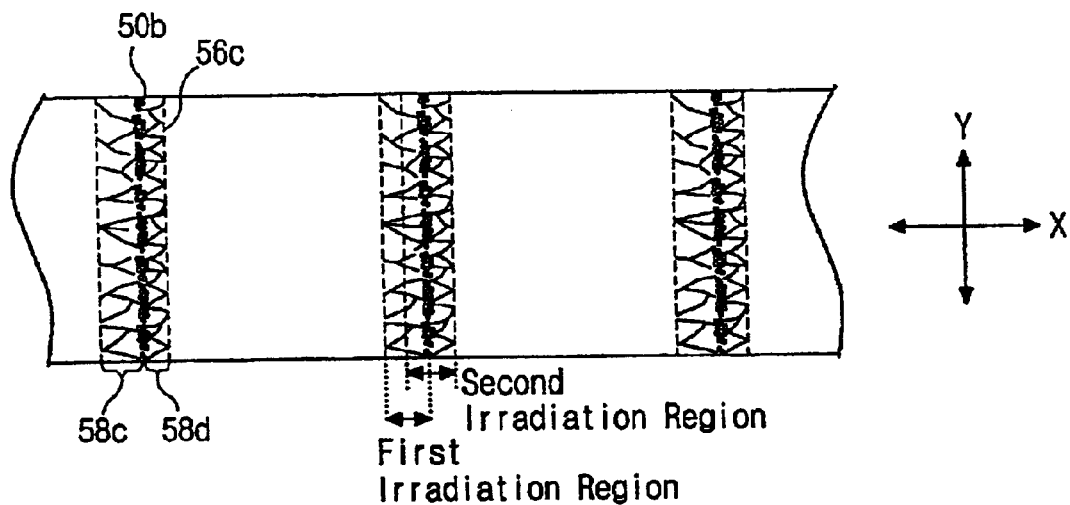
Figure 3C:
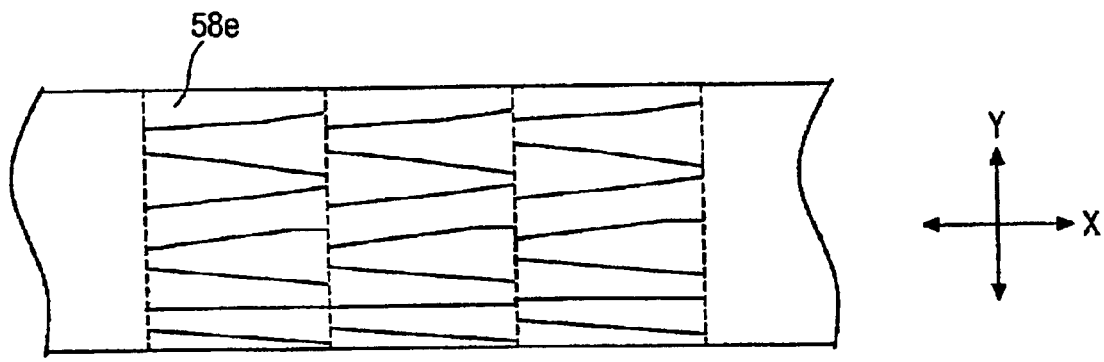

Due to the smaller width of the light transmitting portions "G," the lateral grain growth stops when the grains generated at the interfaces between the un-melted regions and the fully-melted regions collide. In contrast to the crystallization described in FIGS. 3A to 3C, solidification nuclei regions 50a and 50b are not formed when using the mask 160 of FIG. 4.

The SLS using the mask 160 will now be discussed. As described with reference to FIG. 1A, the laser beam 34 passes through the mask 160 and irradiates the amorphous silicon film on the sample substrate 44. The laser beam 34 is divided into three line beams because there are three light transmitting portions "G". Those line beams are reduced by the objective lens 42 to create beam patterns on the amorphous silicon film. As crystallization proceeds, the beam patterns move in an X-axial direction. Because of the X-axis directional movement, crystallization is conducted along a length of the beam pattern. As previously described, the X-Y stage 46 or the mask 160 moves by a distance of several hundred micrometers ($\mu$m) to several millimeters (mm). The larger movement reduces processing time when compared to the SLS method described with reference to FIGS. 3A to 3C.

Figure 5A:
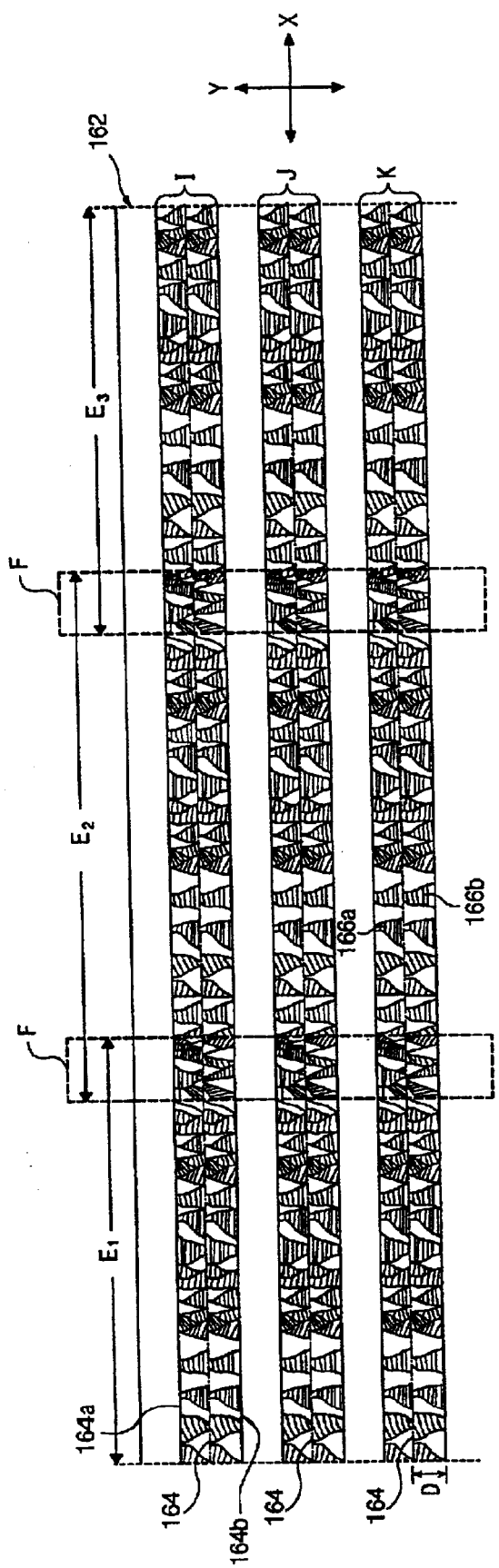
FIGS. 5A to 5C are plan views showing an amorphous silicon film in the crystallization process steps by using the mask shown in FIG. 4.
Figure 5B:
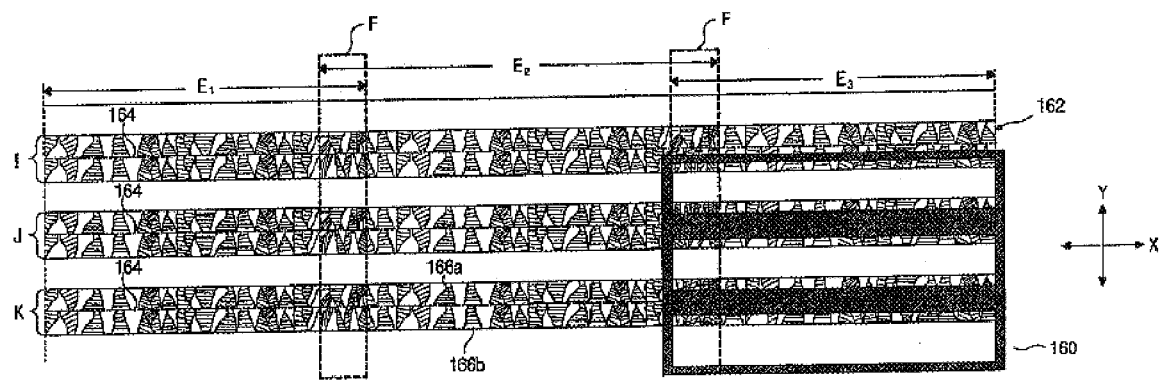
Figure 5C:
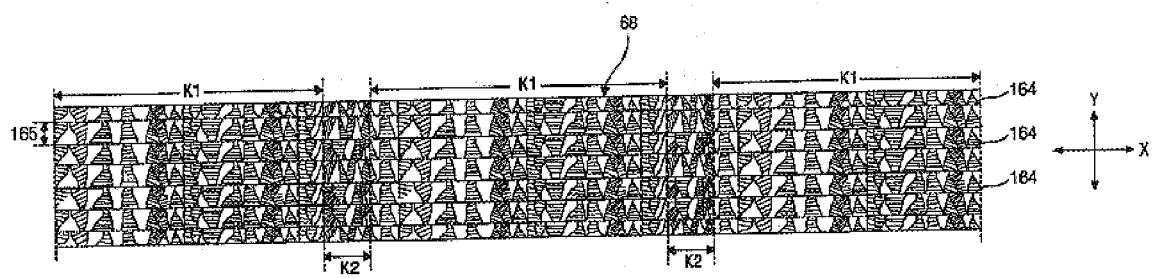

FIGS. 5A to 5C are plan views showing an amorphous silicon film in the crystallization being crystallized using the mask shown in FIG. 4. It is assumed that the mask 160 has three light transmitting portions. As mentioned above, the length of lateral grain growth is determined by the energy density of the laser beam, the temperature of substrate, the thickness of amorphous silicon film, etc. Thus, lateral grain growth of the grains is maximized under optimized conditions. In FIGS. 5A to 5C, it should be understood that the width of the light transmitting portions "G" (in FIG. 4) is smaller than twice the maximum length of lateral grain growth.

Figure 1A:
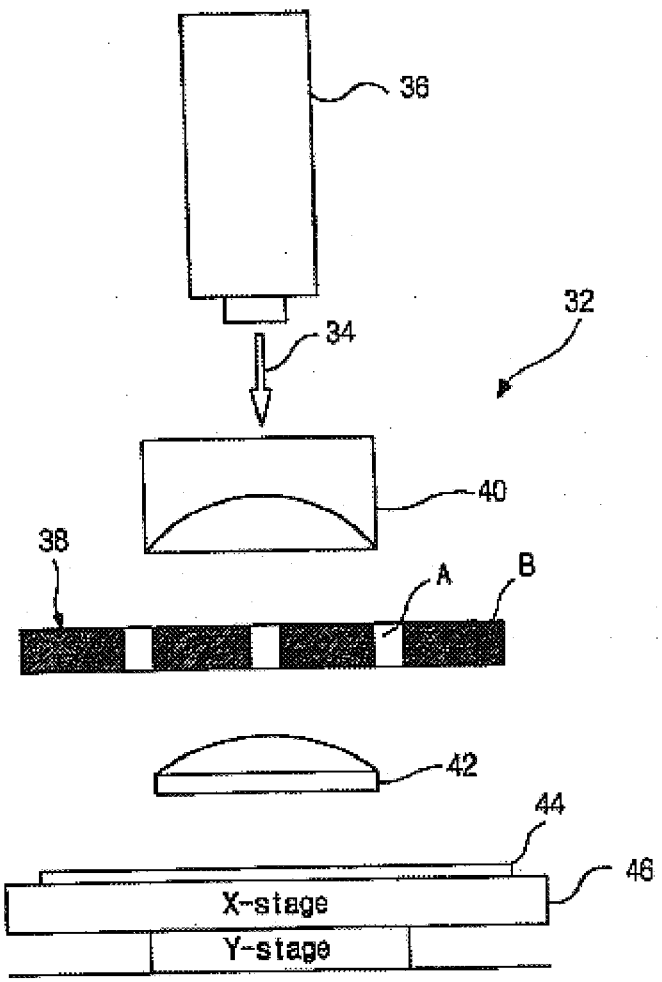
FIG. 1A is a schematic configuration of a sequential lateral solidification (SLS) apparatus according to a conventional art.
Figure 1B:
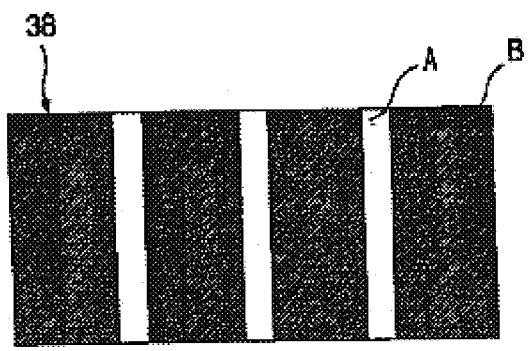
FIG. 1B is a plan view showing a mask of FIG. 1A.
Figure 2:
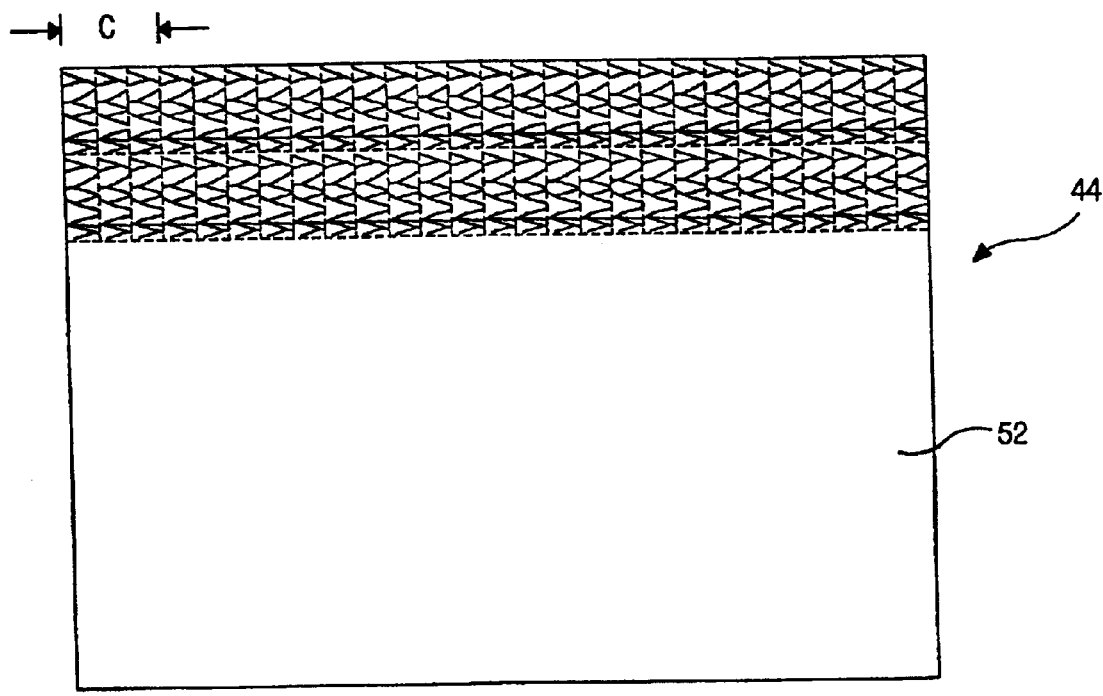
FIG. 2 is a plan view showing a substrate having a partially-crystallized amorphous silicon film.

FIG. 5A shows an initial step of crystallizing the amorphous silicon film. Referring to FIGS. 1A and 5A, the laser beam 34 emitted from the laser generator 36 passes through the mask 160 (which replaces the mask 38) and irradiates a first block E1 of an amorphous silicon film 162 deposited on the sample substrate 44. The laser beam 34 is divided into three line beams by the light transmitting portions "G" The three line beams irradiate and melt regions "I," "J.," and "K" of the amorphous silicon film 162. Since each of the melted regions "I," "J." and "K" corresponds to a light transmitting portion "G." the width of the melted regions "I," "J.," and "K" is less than twice the maximum lateral grain growth. The energy density of the line beams should be sufficient to induce complete melting of the amorphous silicon film, i.e., complete melting regime.

The liquid phase silicon begins to crystallize at the interfaces 164a and 164b between the solid phase amorphous silicon and the liquid phase silicon. Namely, the lateral grain growth of the grains 166a and 166b proceeds from un-melted regions to the fully-melted regions. Then, lateral growth stops in accordance with the width of the melted silicon region when the grains 166a and 166b collide in middle lines 164 of the melted silicon region. The grain boundaries in directionally solidified silicon tend to form perpendicular to the interfaces 164a and 164b between the solid phase amorphous silicon and the liquid phase silicon. As a result of the first laser beam irradiation, the first block $E_1$ is partially crystallized. Thereafter, by way of moving the X-Y stage where the substrate is mounted, the beam patterns moves in the X-axial direction by a distance of several millimeters (mm). Thus, the second irradiation is conducted and the second block $E_2$ is partially crystallized. The crystallization in the X-axis direction is then repeatedly carried out.

As a result of the first to third laser beam irradiations described in FIG. 5A, crystallized regions "I," "J" and "K" are formed in the first to third blocks $E_1$, $E_2$ and $E_3$, each of which corresponds to the mask 160 of FIG. 4, such that crystallized silicon grain regions "I," "J," and "K" result.

Meanwhile, when the mask 160 moves block by block, the mask 160 overlaps a portion of previous block. Namely, the laser beam patterns of the second irradiation overlap the portions of the crystallized regions, which are formed by the first irradiation, and the third laser beam patterns overlap the crystallized portions of the second irradiation. Therefore, overlapped portions "F", which is called crystallization discontinuity hereinafter, are induced as shown in FIG. 5A. In the overlapped portions "F." the grains are not uniform. And thus, if these non-uniform grains are used as an element of the TFT, some TFT characteristics will be deteriorated and the TFT will not operate properly.

The basic cause of the above-mentioned phenomena is the interference and scattering of the laser beam in the edge portions of the light transmitting portions "G" Due to the fact that the left and right square-shaped edges of the light transmitting portion cause the laser beam interference and scattering, the amorphous silicon in that region will be melted in a circular shape and will be circularly crystallized. As mentioned before, the molten silicon is crystallized perpendicular to the interfaces between the liquid silicon and the solid silicon, and thus, the grains formed in the circularly molten regions will be abnormal and discontinuous compared to the grains formed in inner portions.

In FIG. 5B, after the first laser beam irradiation, the X-Y stage or the mask moves in Y-axial direction opposite to the lateral growth of the grains 166a or 166b of FIG. 5A by a distance of several or several tens of micrometers more or less than the maximum length of the lateral growth. Namely, crystallization is conducted block by block in the Y-axis direction. Therefore, the regions irradiated by the laser beam are melted and then crystallized in the manner described in FIG. 5A. At this time, the silicon grains 166a and 166b grown by the first to third laser beam irradiations serve as seeds for this crystallization, and thus the lateral grain growth proceeds in the melted regions in the Y-axis direction.

As a result, silicon grains 165 formed by the sequential lateral solidification (SLS) continue to grow adjacent to the silicon grains 166a or 166b of FIG. 5B as shown in FIG. 5C. Here, the grains 165 have half the distance between the adjacent middle lines 164 of FIG. 5B.

As described before, according to the first embodiment of the present invention, the crystallizing time decreases in the unit area of the amorphous silicon compared to the conventional art. This results in increased productivity.

However, when the amorphous silicon is crystallized by the above-described first embodiment, polycrystalline silicon film 168 of FIG. 5C divided into first crystalline regions "K1" and second crystalline regions "K2." The first crystalline regions "K1" have normal grains that are substantially uniform, while the second crystalline regions "K2" have abnormal grains that are formed discontinuously. The second crystalline regions "K2" corresponds to the overlapped portions "F" of FIGS. 5A and 5B. If the second crystalline regions "K2" are used as active layers in the TFTs, the electron mobility may decrease because the active layers formed by the second crystalline regions "K2" have discontinuous and abnormal grains. Further, if the TFTs having the second crystalline regions "K2" are used as active layers in the liquid crystal panel, discontinuous operating characteristics will occur in the liquid crystal panel and the quality of the LCD device decreases. To overcome these problems, a second embodiment is proposed as follows.

Figure 6A:
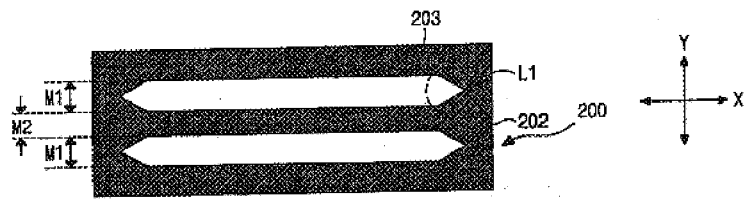
FIGS. 6A and 6B are plan views of masks that are used for crystallization according to a second embodiment of the present invention.
Figure 6B:
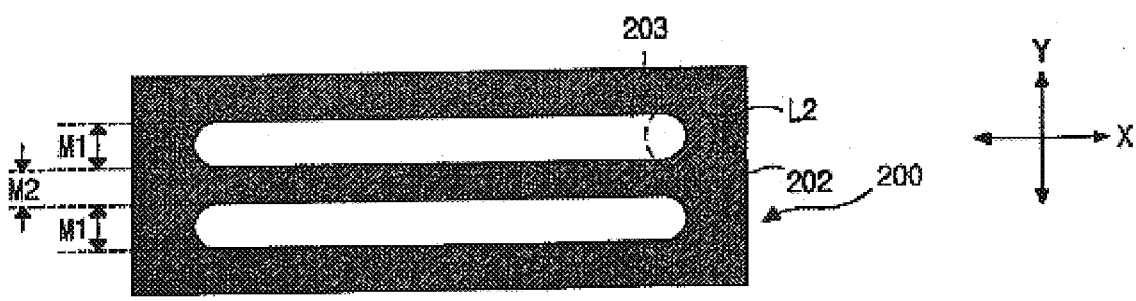

FIGS. 6A and 6B are plan views of masks that are used in a SLS method according to a second embodiment of the present invention. The mask 200 has a light absorptive portion 202 and light transmitting portions 203. Although FIGS. 6A and 6B show only two light transmitting portions 203, respectively, the number of the light transmitting portions 203 can be more than two in the mask 200. A distance "M2" between the adjacent light transmitting portions 203 is less than or equal to a width "M1" of each light transmitting portion 203. At this point, the width "M1" of the light transmitting portions 203 is less than or equal to twice the maximum lateral grain growth length. The light transmitting portions 203 have a stripe shape in an X-axial direction in the mask 200. Edge portions "L1" and "L2" of the light transmitting portions 203 have a triangular shape and semicircular shape, as shown in FIGS. 6A and 6B, respectively.

When the mask 200 has light transmitting portions 200 having triangular-shaped edges "L1" or semicircular-shaped edges "L2," portions of the amorphous silicon corresponding to the triangular-shaped edges "L1" or the semicircular-shaped edges "L2" are not crystallized. That is because the laser beam passing through the triangular-shaped edges "L1" and the semicircular-shaped edges "L2" has lower laser energy. Namely, due to the laser beam interference and scattering in the triangular-shaped edges "L1" and the semicircular-shaped edges "L2," the amorphous silicon portions corresponding to these edges "L1" and "L2" are not completely melted, thereby causing improper crystallization.

Crystallization of amorphous silicon film using the mask 200 of FIG. 6A or FIG. 6B will be explained in detail with reference to FIGS. 7A to 7D. During the crystallizing processes illustrated in FIGS. 7A to 7D, the mask 200 of FIG. 6A having triangular-shaped edges "L1" is adopted. Before starting to crystallize the amorphous silicon, a buffer layer (not shown) is first formed on a substrate 220 and an amorphous silicon film 222 is deposited on the buffer layer. Then, the amorphous silicon film 222 over the substrate 220 is dehydrogenated.

Figure 7A:
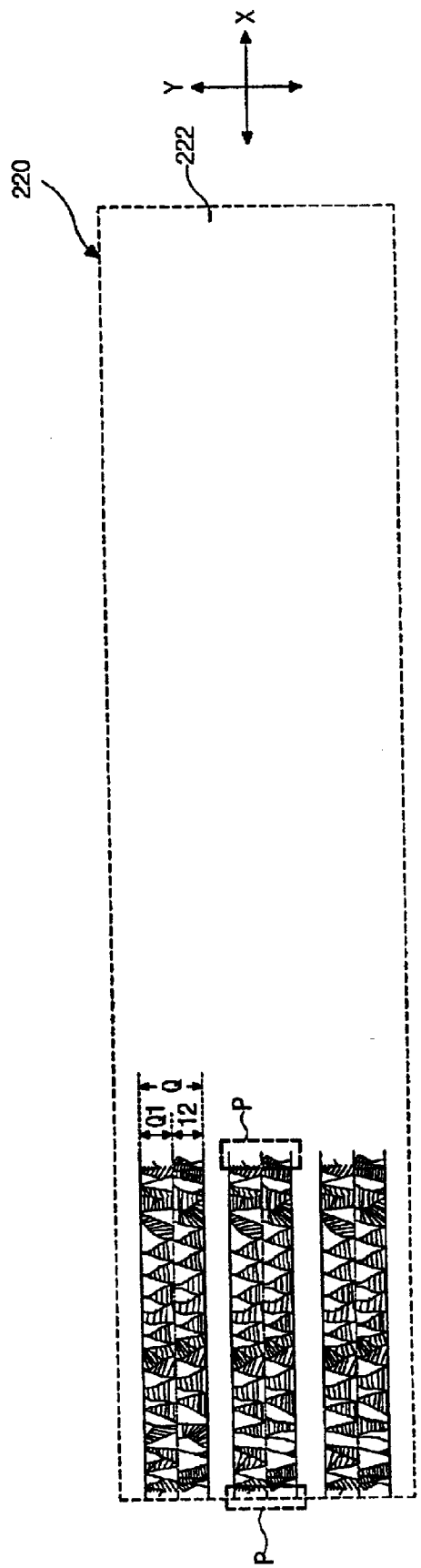
FIGS. 7A to 7D are plan views showing an amorphous silicon film in the crystallization process steps by using the mask shown in FIG. 6A.

Now referring to FIG. 7A, a laser beam having the complete melting regime passes through the mask 200 and irradiates the amorphous silicon film 222, thereby amorphous silicon portions corresponding to the light transmitting portions 203 of FIG. 6A are molten. When the molten silicon is crystallized, grains of first and second grain regions "Q1" and "Q2" grow perpendicular to the interfaces between the liquid silicon and the solid silicon. The grains of the first grain regions "Q1" are formed in a downward direction from the interface to the center, and the grains of the second grain regions "Q2" are formed in a upward direction from the interface to the center. Therefore, the first and second grain regions "Q1" and "Q2" meet in the central part of a grain regions "Q." Since the width "M1" of the light transmitting portions 203 is less than and equal to twice the maximum lateral grain growth length, the grain regions "Q" also have a width that is less than and equal to twice the maximum lateral grain growth length. Therefore, the solidification nuclei regions are not formed in the middle section of each grain region "Q." At this time, edge portions "P" of the grain regions "Q" which correspond to the triangular-shaped edges "L1" are slightly molten and crystallized. As described before, since the laser beam interference and scattering are generated by the triangular-shaped edges "L1," the energy density of the laser beam passing through the triangular-shaped edges "L1" becomes lower. This lower energy could not fully melt and crystallize the amorphous silicon.

Figure 7B:
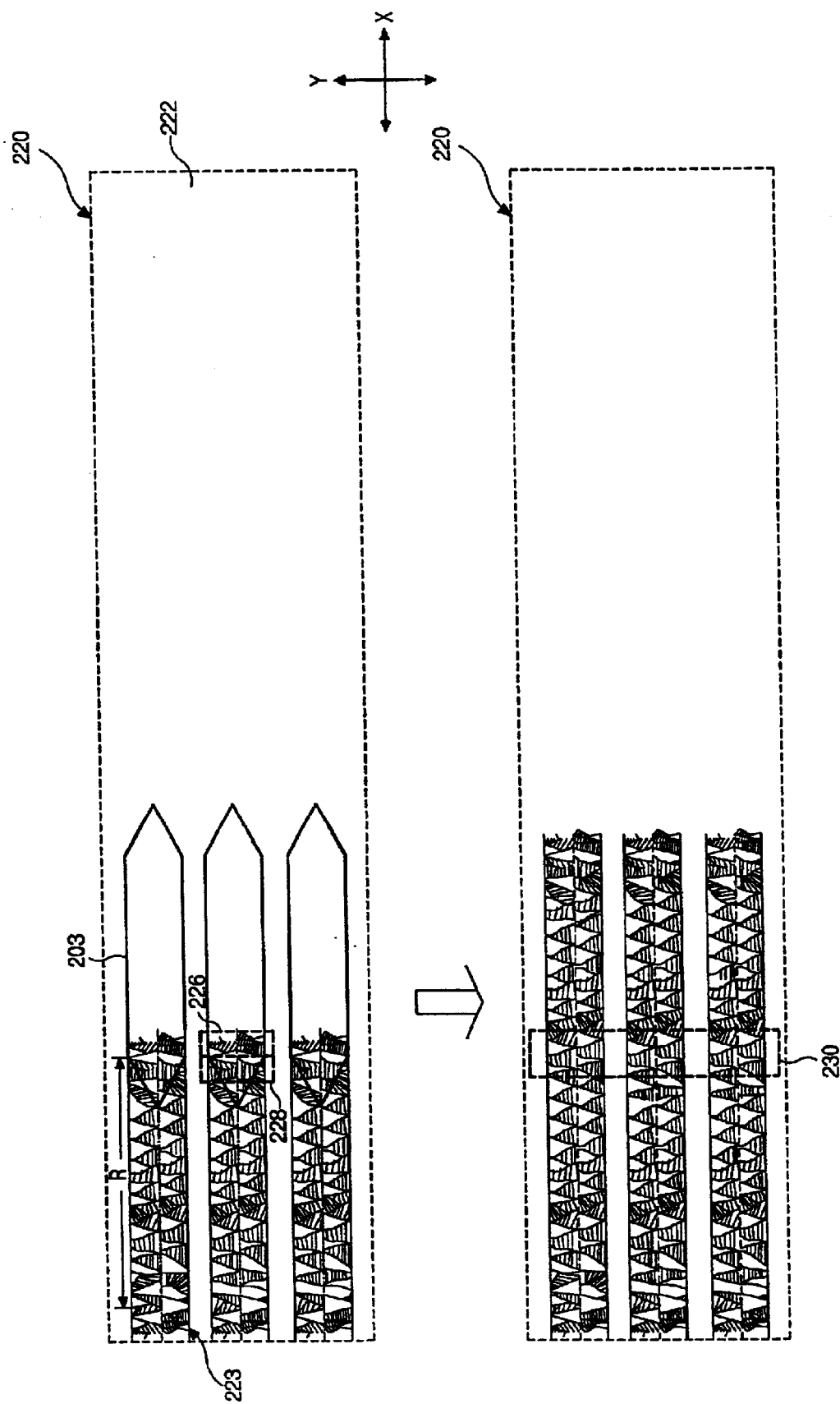

FIG. 7B shows a second irradiation after moving the mask 200 in an X-axial direction. As shown, the mask 200 in which the light transmitting portions 203 have the triangular edges moves in the X-axial direction by less than a distance "R." Here, the distance "R" is defined by the fully and properly crystallized region of the grain region "Q" of FIG. 7B. Thereafter, a second laser beam irradiation is conducted.

The triangular-shaped edges of the light transmitting portions 203 overlap portions 228 of normal grains 223 which are formed by the first laser beam irradiation. Additionally, the light transmitting portions 203 overlap abnormal grains 226 which are formed by the triangular-shaped edges "L1" in the first laser beam irradiation and correspond to the edge portions "P" of the grain regions "Q" of FIG. 7A. The normal grains in the overlapped portions 228 are slightly molten in their surface and brought back to the normal grain state, because the laser beam passing through the triangular-shaped edges has a lower energy density, such as partial melting regime or near complete melting regime. At this time, the abnormal grains 226 are completely molten and re-crystallized, thereby becoming the normal grains as indicated by an area 230.

Figure 7C:
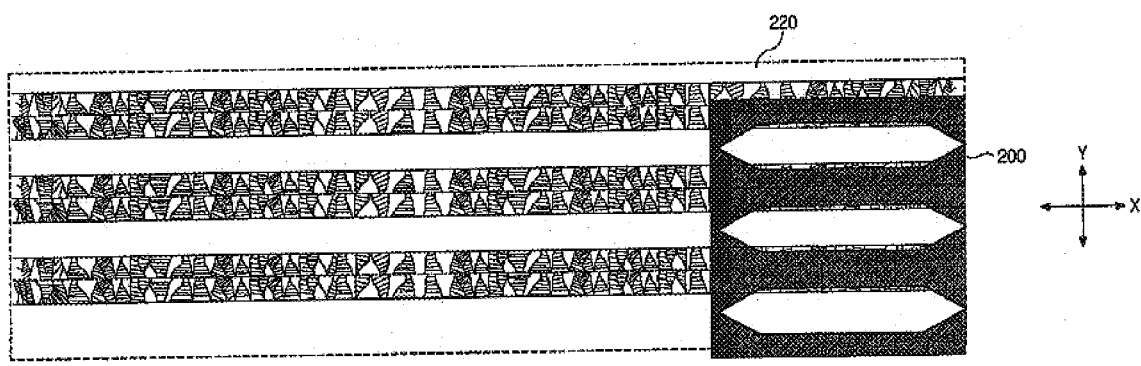

By repeating the foregoing steps of melting and crystallizing, the X-axial crystallization is complete. Thereafter, the X-Y stage or the mask moves in a Y-axial direction opposite to the lateral growth of the grains by a distance of several or several tens of micrometers more or less than the maximum length of the lateral growth, as shown in FIG. 7C. Then, the regions irradiated by the laser beam are melted and then crystallized in the manner described in FIGS. 7A and 7B, thereby completing the second X-axis directional crystallization.

Figure 7D:
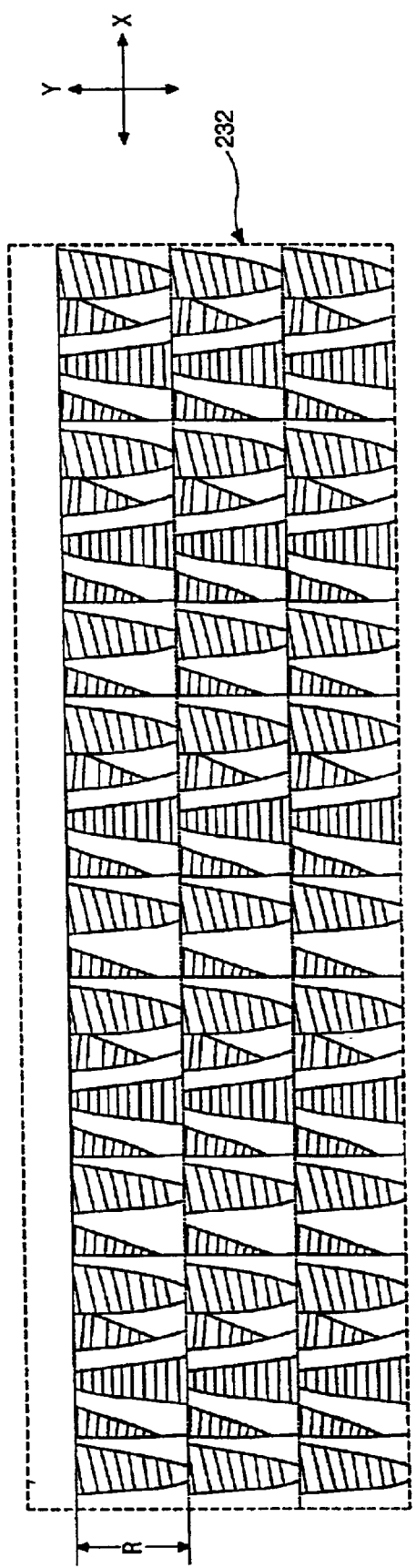

As a result, silicon grain regions 165 where the abnormal grains do not exist are formed by the sequential lateral solidification (SLS) according to the present invention, as shown in FIG. 7D. Namely, a polycrystalline silicon film 232 having silicon grain regions 165 is finally formed all over the substrate and used as an element of the TFT.

The crystalline silicon layer formed by the first and second embodiments, as described above, can be used as an active layer of a thin film transistor, among other uses, such as driving devices and switching devices.

When the resolution of a liquid crystal display device becomes greater, the pad pitch of the signal lines and scanning lines is reduced. Thus, it becomes more difficult to bond a Tape Carrier Package (TCP) to the pads. However, SLS grown polycrystalline silicon can be used for driving Integrated Circuits (ICs) and can be formed on the same substrate as the thin film transistors. Such formation of driving ICs on a substrate decreases production costs and can ease fabrication difficulties.

Figure 8:
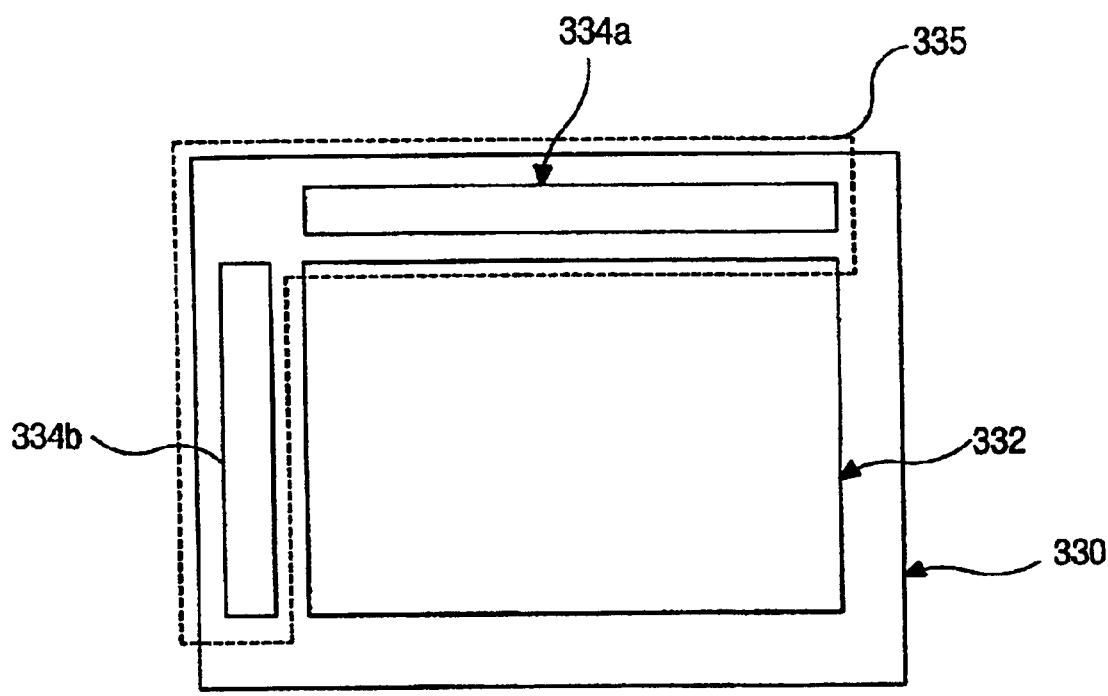
FIG. 8 is a schematic plan view of a liquid crystal display panel including a data driving circuit and a gate driving circuit where the crystalline active layers are adopted according to the present invention.

FIG. 8 is a schematic view of a liquid crystal display panel that includes a data driving circuit 334a and a gate driving circuit 334b both of which use crystalline active layers fabricated according to the present invention.

As shown in FIG. 8, a liquid crystal panel 330 includes a display region 332 and a driving region 335. In the display region 332 are a plurality of switching devices, i.e., thin film transistors (TFTs). The data driving circuit 334a and the gate driving circuit 334b are also disposed in the driving region 335. These driving circuits 334a and 334b include a plurality of Complementary Metal Oxide Semiconductor (CMOS) devices.

Figure 9:
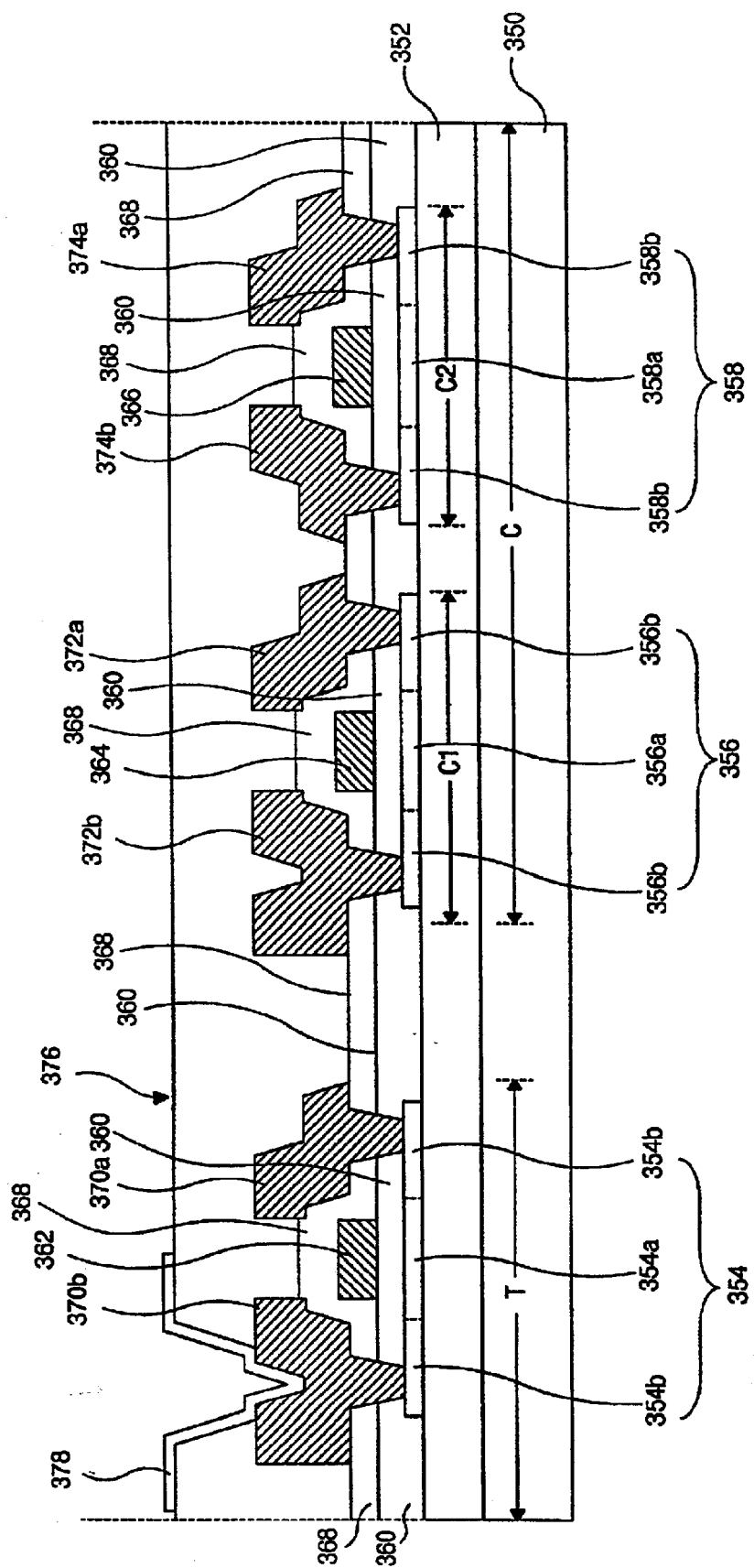
FIG. 9 is a plan view showing a switching device and CMOS transistors.

As shown in FIG. 9, a CMOS device "C" is comprised of an N-type TFT "C1" and a P-type TFT "C2" which are driven by an inverter relative to each other in the normal totem pole fashion. Since the CMOS device "C" consumes little electric power, it is a very suitable driving circuit. Such CMOS devices require fast operating characteristics that are met by active layers comprised of polycrystalline silicon formed by one of above-described inventive methods. Further, since the TFT "T" of FIG. 9 is formed of polycrystalline silicon fabricated according to the principles of the present invention; it has high electron mobility, which improves display quality.

The fabrication process for the CMOS device "C" and the thin film transistor "T" will be explained as follows. The thin film transistor "T" is an N-type for example.

First, a buffer layer 352 is formed on a transparent substrate 350. An amorphous silicon (a-Si:H) layer that includes hydrogen is formed on the buffer layer 352. The amorphous silicon is then dehydrogenated. Thereafter, the amorphous silicon layer is crystallized using one of the aforementioned methods (first or second embodiments), thereby forming a polycrystalline silicon layer.

The polycrystalline silicon layer is then patterned to form first to third active layers 354, 356 and 358. The first polycrystalline silicon active layer 354 is divided into an active channel region 354a and two doping regions 354b that are disposed on both sides of the active channel region 354a. Furthermore, the second polycrystalline silicon active layer 356 is divided into an active channel region 356a and two doping regions 356b, and the third polycrystalline silicon active layer 358 is divided into an active layer 358a and two doping regions 358b. A first insulation layer 360 is formed on the buffer layer 352 so as to cover the polycrystalline silicon active layers 354, 356 and 358. Gate electrodes 362, 364 and 366 are then formed on the first insulation layer 360, particularly over the active channel regions 354a, 356a and 358a.

Thereafter, the doping regions 354b, 356b and 358b are doped while using the gate electrodes 362, 364 and 366 as masks. The doping regions 354b and 356b are doped by $n^+$ions, whereas the doping regions 358b are doped by $p^+$ions. Therefore, the transistors "T" and "C1" become N-type transistors and the transistor "C2" becomes a P-type transistor.

Thereafter, a second insulation layer 368 is formed on the first insulation layer 360 to cover the gate electrodes 362, 364 and 366. The first and second insulation layers 360 and 368 are then patterned to form contact holes that expose impurity-doped regions 354b, 356b and 358b. After patterning the first and second insulation layers 360 and 368, a metal layer is formed on the second insulation layer 368. The metal layer is then patterned to form source electrodes 370a, 372a and 374a and drain electrodes 370b, 372b and 374b. As shown in FIG. 9, the source electrodes 370a, 372a and 374a contact the impurity-doped regions 354b, 356b and 358b, respectively, on the right side of the transistors. The drain electrodes 370b, 372b and 374b also contact the impurity-doped regions 354b, 356b and 358b, respectively, on the left side of the transistors. Therefore, the thin film transistor "T" and the CMOS device "C" are formed. A passivation layer 376 is then formed on the second insulation layer 368 to cover all transistors "T", "C1" and "C2". The passivation layer 376 is then patterned to expose a portion of the drain electrode 370b of the thin film transistor "T". Thus, a pixel electrode 378 formed on the passivation layer 376 contacts the drain electrode 370b of the thin film transistor "T".

The switching devices and operating devices shown in FIG. 9 are fabricated using the polycrystalline silicon that is crystallized by the first and second embodiments of the present invention, so that the process time can be substantially shortened and the manufacturing yield increases.

According to the SLS method of the present invention, since the X-Y stage and the mask move a distance of several hundred micrometers to several millimeters when crystallizing the amorphous silicon film, the crystallization time and the fabricating process time are dramatically reduced over prior art methods. Furthermore, since the light transmitting portions of the mask have triangular or semicircular edges on both sides, the continuous and normal silicon grains are formed in all of the polycrystalline silicon film. Accordingly, when the polycrystalline silicon that is crystallized by the present invention is employed in the switching and driving devices of the liquid crystal panel, their electrical and operating characteristics will be improved.

It will be apparent to those skilled in the art that various modifications and variations can be made in the method of crystallizing the amorphous silicon without departing from the spirit or scope of the invention. Thus, it is intended that the present invention cover the modifications and variations of this invention provided they come within the scope of the appended claims and their equivalents.

What is claimed is:

1. A method of crystallizing an amorphous silicon film, comprising;
    locating a substrate having an amorphous silicon film in a sequential lateral solidification (SLS) apparatus;
    irradiating the amorphous silicon film in a first irradiated region using a laser beam that passes through a mask, wherein the mask includes a light absorptive portion for blocking a laser beam and a plurality of stripe-shaped light transmitting portions for passing the laser beam, wherein each light-transmitting portion includes triangular-shaped edges on both sides, and wherein laterally growing grains are formed by growing laterally from an interface between liquid silicon and solid silicon;
    moving the mask in an X-axial direction by a distance less than the length of the light transmitting portions to overlap the previously crystallized grain regions; and
    performing a second crystallization such that laterally growing grains grow in a second irradiated region.

2. The method of claim 1, further comprising transversely moving the mask a plurality of times to complete the X-axis directional crystallization.

3. The method of claim 2, further comprising moving the mask in a Y-axial direction by a distance less than the width of light transmitting portions after the amorphous silicon film is crystallized in the X-axial direction.

4. The method of claim 3, further comprising conducting a second X-axis directional crystallization after moving the mask in the Y-axial direction.

5. The method of claim 1, wherein the distance between the adjacent light transmitting portions is less than the width of the light transmitting portion.

6. The method of claim 1, wherein the width of the light transmitting portions is less than or equal to twice the maximum length of lateral grain growth that is to be grown by sequential lateral solidification (SLS).

7. A method of crystallizing an amorphous silicon film, comprising:
    locating a substrate having an amorphous silicon film in a sequential lateral solidification (SLS) apparatus;
    irradiating the amorphous silicon film in a first irradiated region using a laser beam that passes through a mask, wherein the mask includes a light absorptive portion for blocking a laser beam and a plurality of stripe-shaped light transmitting portions for passing the laser beam, wherein each light-transmitting portion includes semicircular-shaped edges on both sides, and wherein laterally growing grains are formed by growing laterally from an interface between liquid silicon and solid silicon;
    moving the mask in an X-axial direction by a distance less than the length of the light transmitting portions to overlap the previously crystallized grain regions; and
    performing a second crystallization such that laterally growing grains grows in a second irradiated region.

8. The method of claim 7, further comprising transversely moving the mask a plurality of times to complete the X-axis directional crystallization.

9. The method of claim 8, further comprising moving the mask in a Y-axial direction by a distance less than the width of light transmitting portions after the amorphous silicon film is crystallized in the X-axial direction.

10. The method of claim 9, further comprising conducting a second X-axis directional crystallization after moving the mask in the Y-axial direction.

11. The method of claim 7, wherein the distance between the adjacent light transmitting portions is less than the width of the light transmitting portion.

12. The method of claim 7, wherein the width of the light transmitting portions is less than or equal to twice the maximum length of lateral grain growth that is to be grown by sequential lateral solidification (SLS).

13. A method of crystallizing an amorphous silicon film, comprising:
    locating a substrate having an amorphous silicon film in a sequential lateral solidification (SLS) apparatus;
    irradiating the amorphous silicon film in a first irradiated region using a laser beam that passes through a mask, wherein the mask includes a light absorptive portion for blocking a laser beam and a plurality of rectangular stripe-shaped light transmitting portions for passing the laser beam, and wherein laterally growing grains are formed by growing laterally from an interface between liquid silicon and solid silicon;
    moving the mask in an X-axial direction by a distance less than the length of the light transmitting portions to overlap the previously crystallized grain regions; and
    performing a second crystallization such that laterally growing grains grows in a second irradiated region.

14. The method of claim 3, further comprising transversely moving the mask a plurality of times to complete the X-axis directional crystallization.

15. The method of claim 4, further comprising moving the mask in a Y-axial direction by a distance less than the width of light transmitting portions after the amorphous silicon film is crystallized in the X-axial direction.

16. The method of claim 15, further comprising conducting a second X-axis directional crystallization after moving the mask in the Y-axial direction.

17. The method of claim 13, wherein the distance between the adjacent light transmitting portions is less than the width of the light transmitting portion.

18. The method of claim 3, wherein the width of the light transmitting portions is less than or equal to twice the maximum length of lateral grain growth that is to be grown by sequential lateral solidification (SLS).

* * * * *